United States Patent
Nozoe et al.

(10) Patent No.: US 8,013,500 B2
(45) Date of Patent: Sep. 6, 2011

(54) PIEZOELECTRIC DEVICE, ELECTRONIC DEVICE USING THE SAME, AND AUTOMOBILE

(75) Inventors: Toshiyuki Nozoe, Kyoto (JP); Hideo Ohkoshi, Osaka (JP)

(73) Assignee: Panasonic Corporation, Osaka (JP)

( * ) Notice: Subject to any disclaimer, the term of this patent is extended or adjusted under 35 U.S.C. 154(b) by 17 days.

(21) Appl. No.: 12/680,641

(22) PCT Filed: Nov. 5, 2008

(86) PCT No.: PCT/JP2008/003175
§ 371 (c)(1),
(2), (4) Date: Mar. 29, 2010

(87) PCT Pub. No.: WO2009/069251
PCT Pub. Date: Jun. 4, 2009

(65) Prior Publication Data
US 2010/0213796 A1    Aug. 26, 2010

(30) Foreign Application Priority Data
Nov. 27, 2007 (JP) ................. 2007-305412

(51) Int. Cl.
*H01L 41/08* (2006.01)

(52) U.S. Cl. .................... 310/351; 310/344; 310/348

(58) Field of Classification Search .......... 310/344, 310/348, 351–353
See application file for complete search history.

(56) References Cited

U.S. PATENT DOCUMENTS

| 4,266,157 | A | * | 5/1981 | Peters | 310/353 |
|---|---|---|---|---|---|
| 5,635,672 | A | * | 6/1997 | Kawaura | 174/564 |
| 5,841,217 | A | * | 11/1998 | Kizaki et al. | 310/348 |
| 6,628,048 | B2 | * | 9/2003 | Moon et al. | 310/348 |
| 6,984,925 | B2 | * | 1/2006 | Morley et al. | 310/348 |
| 7,053,521 | B2 | * | 5/2006 | Baumgartner | 310/311 |
| 7,145,416 | B2 | * | 12/2006 | Mizuno | 333/186 |
| 7,235,916 | B2 | * | 6/2007 | Chou | 310/355 |
| 2002/0007118 | A1 | | 1/2002 | Adachi et al. | |
| 2007/0138914 | A1 | | 6/2007 | Ishikawa et al. | |

FOREIGN PATENT DOCUMENTS

| CN | 1983658 A | 6/2007 |
|---|---|---|
| JP | 2000-304763 A | 11/2000 |
| JP | 2001-258879 A | 9/2001 |
| JP | 2007-165664 A | 6/2007 |
| JP | 2007-167854 | 7/2007 |
| JP | 2007-167854 A | 7/2007 |

OTHER PUBLICATIONS

International Search Report for PCT/JP2008/003175.
Chinese Office Action dated May 11, 2011.

* cited by examiner

*Primary Examiner* — Mark Budd
(74) *Attorney, Agent, or Firm* — Pearne & Gordon LLP

(57) ABSTRACT

A piezoelectric device according to the present invention includes lead wires (12) each having one end electrically connected to a circuit pattern, and a piezoelectric oscillator (13) made of quartz and having terminals (13a) electrically connected to the other ends of the lead wires (12), wherein the terminals (13a) of the piezoelectric oscillator (13) and the lead wires (12) are respectively capacitively coupled with each other via an insulation layer (14). According to the structure, the piezoelectric device can reduce its vertical height.

8 Claims, 5 Drawing Sheets

PIEZOELECTRIC DEVICE, ELECTRONIC DEVICE USING THE SAME, AND AUTOMOBILE

TECHNICAL FIELD

The present invention relates to a piezoelectric device used in, for example, an electronic device such as a digital camera and an automobile, and an electronic device and an automobile in which the piezoelectric device is used.

BACKGROUND ART

As shown in FIG. 10, a conventional piezoelectric device of this type thus available includes outer housing 1, lead wires 2 each having one end disposed on bottom surface 1a of outer housing 1, and piezoelectric oscillator 3 retained by the other ends of lead wires 2, wherein terminals 3a of piezoelectric oscillator 3 and lead wires 2 are respectively electrically connected to each other by, for example, metal bumps 4.

In the conventional piezoelectric device having the structure, an alternate-current signal outputted from, for example, IC, is transmitted to piezoelectric oscillator 3 by way of lead wires 2 and metal bumps 4, and piezoelectric oscillator 3 is thereby driven. Then, an alternate-current detection signal outputted from piezoelectric oscillator 3 travels on the same route backward, more specifically, the signal is transmitted to the IC or the like by way of metal bumps 4 and lead wires 2.

An example of the conventional art documents relating to the present application is Patent Document 1.

The conventional problem of such a conventional piezoelectric device was difficulty in reducing its vertical height.

In other words, in the conventional structure, since metal bumps 4 are formed by a bonding process between lead wires 2 and terminals 3a of piezoelectric oscillator 3, it was difficult to reduce the thickness of metal bumps 4, therefore, leading to the difficulty in reducing the vertical height of the device.
Patent Document 1: Unexamined Japanese Patent Publication No. 2007-167854

DISCLOSURE OF THE INVENTION

A main object of the present invention is to reduce a vertical height of a piezoelectric device having a structure where lead wires retain a piezoelectric oscillator.

A piezoelectric device according to the present invention includes lead wires each having one end electrically connected to a circuit pattern, and a piezoelectric oscillator made of quartz and having terminals electrically connected to the other ends of the lead wires, wherein the terminals of the piezoelectric oscillator and the lead wires are respectively capacitively coupled with each other via an insulation layer.

In the piezoelectric device according to the present invention, since the terminals of the piezoelectric oscillator and the lead wires are respectively capacitively coupled with each other with the insulation layer interposed therebetween, it is unnecessary to additionally provide, for example, metal bumps between the terminals of the piezoelectric oscillator and the lead wires. The omission of the metal bumps makes it unnecessary to perform a step of bonding the metal bumps and the like. Such an advantageous structure enables the transmission of an alternate-current signal between the piezoelectric oscillator and the lead wires through the insulation layer that can be formed as a very thin film. As a result, the piezoelectric device can have a structure favorably reduced in its vertical height by a dimension equal to the thickness of the metal bumps.

Figure 1:
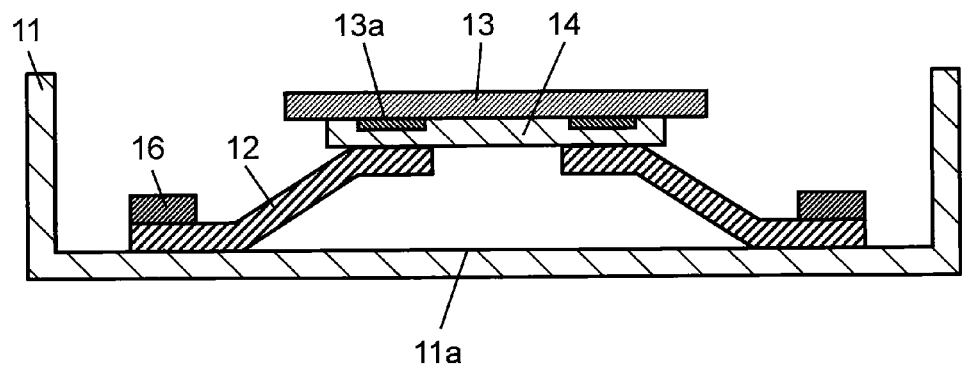
FIG. 1 is a sectional view of a piezoelectric device according to embodiment 1 of the present invention.

REFERENCE MARKS IN THE DRAWINGS 11 outer housing
11a bottom surface
12 lead wire
13 piezoelectric oscillator
13a terminal
14 insulation layer

PREFERRED EMBODIMENTS FOR CARRYING OUT THE INVENTION

Hereinafter, embodiments of the present invention are described referring to the drawings. To help the drawings be clearly understood, a dimension in a thickness direction is enlarged. The same structural elements are shown with the same reference marks, and description of such structural elements, if redundant, may not be repeated.

Embodiment 1

As shown in FIG. 1, a piezoelectric device according to embodiment 1 of the present invention includes outer housing 11 such as a ceramic package, lead wires 12 each having one end disposed on bottom surface 1a of outer housing 11, and piezoelectric oscillator 13 made of quartz and retained by the other ends of lead wires 12. Lead wires 12 are provided in a bent shape. Accordingly, piezoelectric oscillator 13 is retained by lead wires 12 in suspension in outer housing 11. The one ends of lead wires 12 are respectively held by support substrates 16.

Terminals 13a of piezoelectric oscillator 13 and lead wires 12 are respectively capacitively coupled with each other with insulation layer 14 interposed therebetween.

Though not shown in the drawing, on bottom surface 11a is formed an IC for driving the piezoelectric device according to embodiment 1 and detecting a signal from the piezoelectric device, and a circuit pattern electrically connected to the IC.

The one ends of lead wires 12 are electrically connected to the circuit pattern. In the formation of the circuit pattern, a TAB (Tape Automated Bonding) substrate is preferably used so that the piezoelectric device can be further reduced in its vertical height.

As described, the piezoelectric device according to the present invention has the structure where terminals 13a of piezoelectric oscillator 13 and lead wires 12 are respectively capacitively coupled with each other with insulation layer 14 interposed therebetween. According to the structure, it is unnecessary to additionally provide, for example, metal bumps between terminals 13a and lead wires 12, making it unnecessary to perform a step of bonding the metal bumps. Further, in the piezoelectric device according to the present invention, an alternate-current signal can be transmitted between lead wires 12 and piezoelectric oscillator 13 using insulation layer 14 that can be formed as a very thin film. As a result, the piezoelectric device can be reduced in its vertical height.

Materials of insulation layer 14 are, for example, resin such as epoxy, silicon dioxide ($SiO_2$) and silicon nitride (SiN). In the case where insulation layer 14 is made of resin such as epoxy, the resin is applied to a surface of piezoelectric oscillator 13 where terminals 13a are formed, and lead wires 12 are then bonded thereto by, for example, an adhesive.

Figure 2:
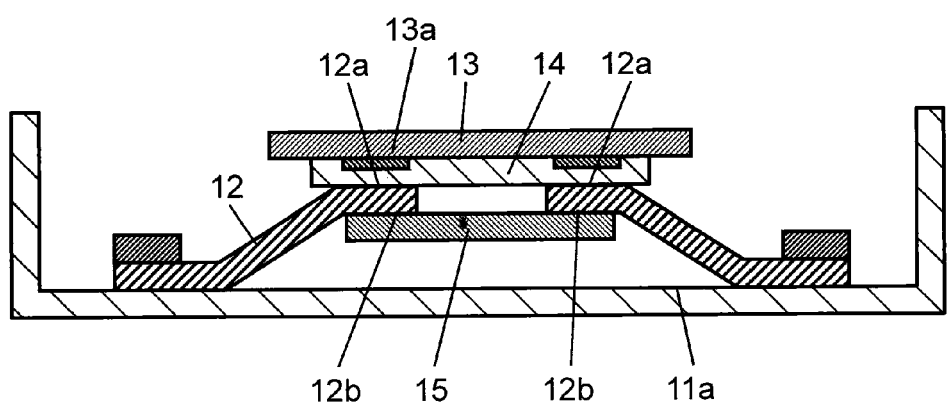
FIG. 2 is a sectional view showing another example of the piezoelectric device according to embodiment 1 of the present invention.

At the other ends of lead wires 12, it is desirable to provide support member 15 on surfaces 12b opposite to retaining surfaces 12a for connecting lead wires 12 to piezoelectric oscillator 13 as shown in FIG. 2. According to the structure where support member 15 is thus provided on surfaces 12b opposite to retaining surfaces 12a for connecting lead wires 12 to piezoelectric oscillator 13 at the other ends of lead wires 12, a stress applied to between lead wires 12 and insulation layer 14 can be dispersed in support member 15. This avoids such an unfavorable event that the stress may be locally concentrated on where lead wires 12 and insulation layer 14 are connected. As a result, the device can improve its reliability in, for example, mechanical and electric characteristics.

Materials of support member 15 are, for example, heat resistant resins such as polyimide and epoxy. More specifically, any of these resins is solidified in a plate shape and bonded to the opposite surfaces by, for example, an adhesive.

Support member 15 is provided from surfaces 12b opposite to retaining surfaces 12a for connecting lead wires 12 to piezoelectric oscillator 13 at the other ends of lead wires 12 to such a position that enables a surface contact with insulation layer 14. Accordingly, an area where support member 15 contacts lead wires 12 and insulation layer 14 can be increased, and lead wires 12 and insulation layer 14 can be more inseparably bonded to each other by support member 15. As a result, these members can preferably improve their reliability in view of electrical connection. Support member 15 thus useful can be formed by applying heat resistant liquid resin such as polyimide or epoxy to lead wires 12 and insulation layer 14 and then curing the applied resin.

Figure 3:
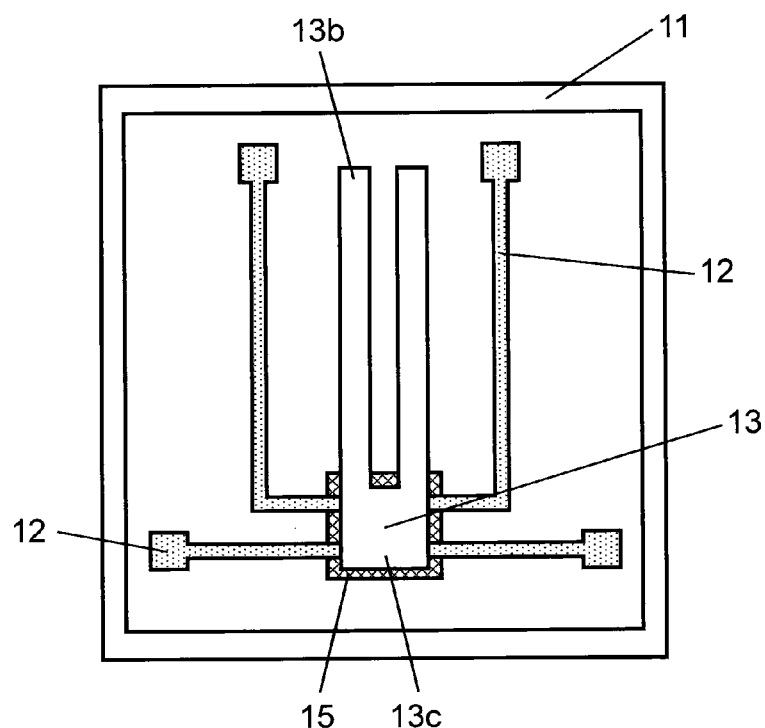
FIG. 3 is an upper view of the piezoelectric device according to embodiment 1 of the present invention.
Figure 4:
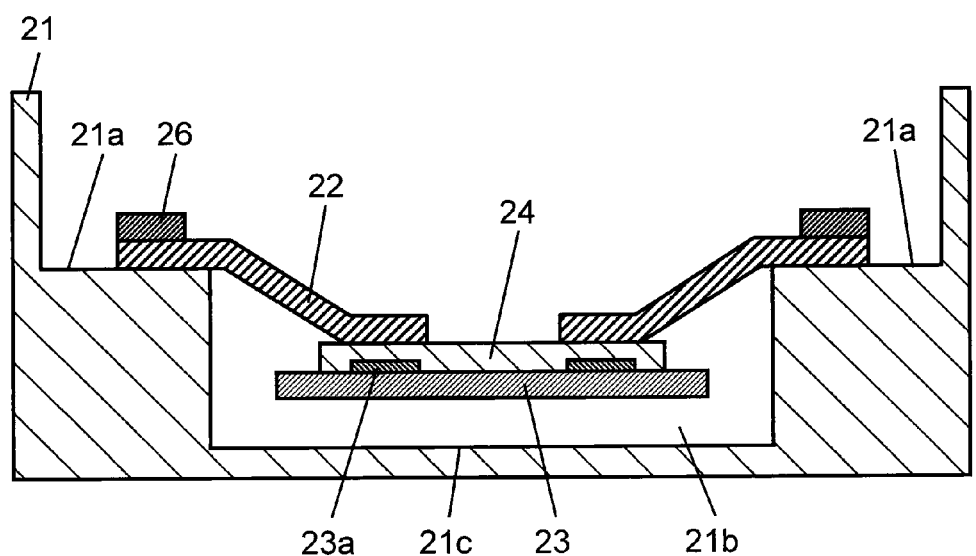
FIG. 4 is a sectional view of a piezoelectric device according to embodiment 2 of the present invention.

FIG. 3 shows an example in which piezoelectric oscillator 13 has base portion 13c and leg portion 13b, and the other ends of lead wires 12 are electrically connected to terminals 13a provided in base portion 13c. As shown in FIG. 3, support member 15 is desirably formed so that an area thereof is equal to or larger than a surface area of base portion 13c where lead wires 12 are connected to terminals 13a because a stress generated by piezoelectric oscillator 13 can be thereby dispersed to a larger extent.

Figure 6:
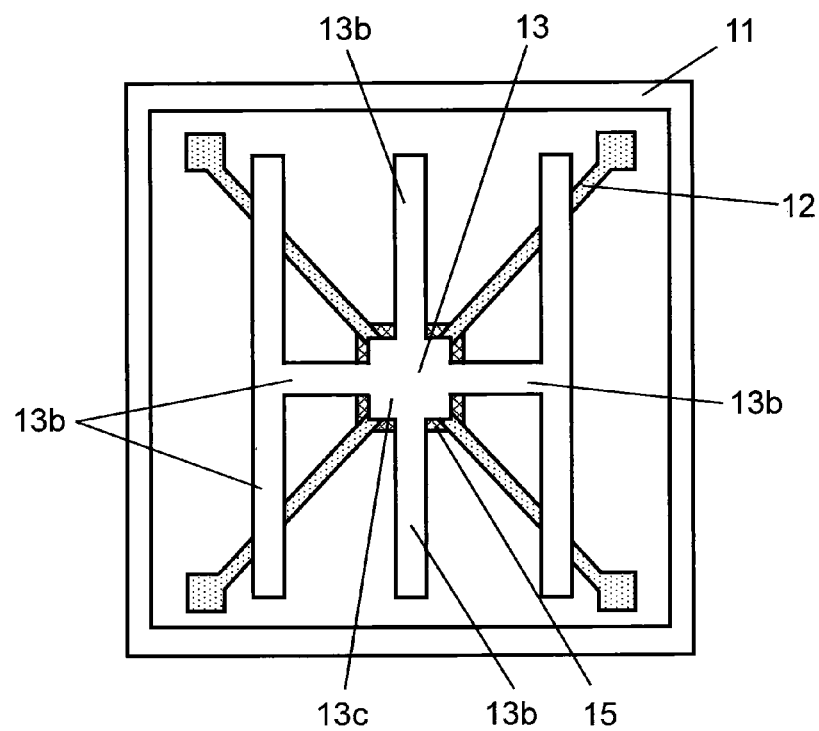
FIG. 6 is an upper view showing another example of the piezoelectric devices according to embodiments 1 and 2 of the present invention.
Figure 7:
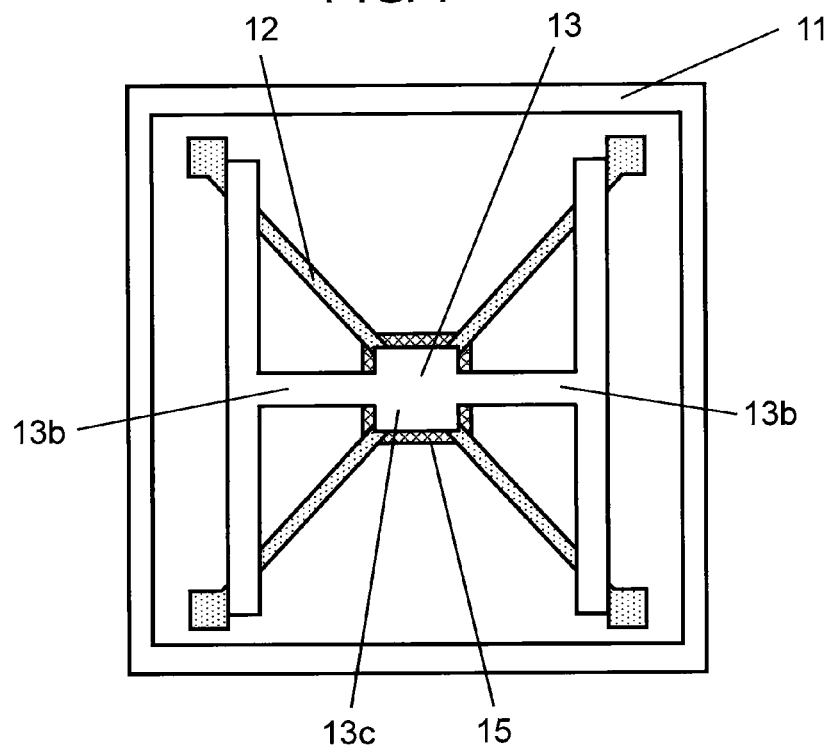
FIG. 7 is an upper view showing another example of the piezoelectric devices according to embodiments 1 and 2 of the present invention.

Piezoelectric oscillator 13 does not necessarily have the shape of a tuning fork shown in FIG. 3, and may have a structure where a plurality of leg portions 13b are provided in one base portion 13c as shown in FIGS. 6 and 7 described later.

The IC and the circuit pattern may be formed outside of outer housing 11 and electrically connected to one ends of lead wires 12 through via holes. However, the circuit pattern is desirably formed inside outer housing 11 because the elements and the circuit pattern can be integrally combined by outer housing 11.

Embodiment 2

Hereinafter, a piezoelectric device according to a preferred embodiment 2 of the present invention is described referring to the drawings.

A ceramic package, for example, constitutes the piezoelectric device according to embodiment 2. The piezoelectric device includes outer housing 21 having a recessed portion 21b in bottom surface 21a thereof, lead wires 22 each having one end disposed on bottom surface 21a of outer housing 21 and extending inward of recessed portion 21b, and piezoelectric oscillator 23 made of quartz and retained by the other ends of lead wires 22. Lead wires 22 are provided in a bent shape, and piezoelectric oscillator 23 is thereby retained in suspension in recessed portion 21b of outer housing 21. The one ends of lead wires 22 are respectively held by support substrates 26.

Terminals 23a of piezoelectric oscillator 23 and lead wires 22 are respectively capacitively coupled with each other with insulation layer 24 interposed therebetween.

Though not shown in the drawing, on bottom surface 21a or bottom surface 21c of recessed portion 21b is formed an IC for driving the piezoelectric device according to embodiment 2 and detecting a signal from the piezoelectric device, and a circuit pattern electrically connected to the IC. When the one ends of lead wires 22 are electrically connected to the circuit pattern, signals can be transmitted to and received from oscillator 23 and the IC, and an overall operation of the piezoelectric device is thereby enabled. In the formation of the circuit pattern, a TAB substrate is preferably used so that the piezoelectric device can be further reduced in its vertical height.

As described, the piezoelectric device according to embodiment 2 has the structure where terminals 23a of piezoelectric oscillator 23 and lead wires 22 are respectively capacitively coupled with each other with insulation layer 24 interposed therebetween. According to the structure, it is unnecessary to additionally provide, for example, metal bumps between terminals 23a and lead wires 22, making it unnecessary to perform a step of bonding the metal bumps. Further, in the piezoelectric device according to the present invention, an alternate-current signal can be transmitted between lead wires 22 and piezoelectric oscillator 23 using insulation layer 24 that can be formed as a very thin film. As a result, the piezoelectric device can be reduced in its vertical height.

Materials of insulation layer 24 are, for example, resin such as epoxy, silicon dioxide ($SiO_2$) and silicon nitride (SiN). In the case where insulation layer 24 is made of resin such as epoxy, the resin is applied to a surface of piezoelectric oscillator 23 where terminals 23a are formed, and lead wires 22 are then bonded thereto by, for example, an adhesive.

Figure 5:
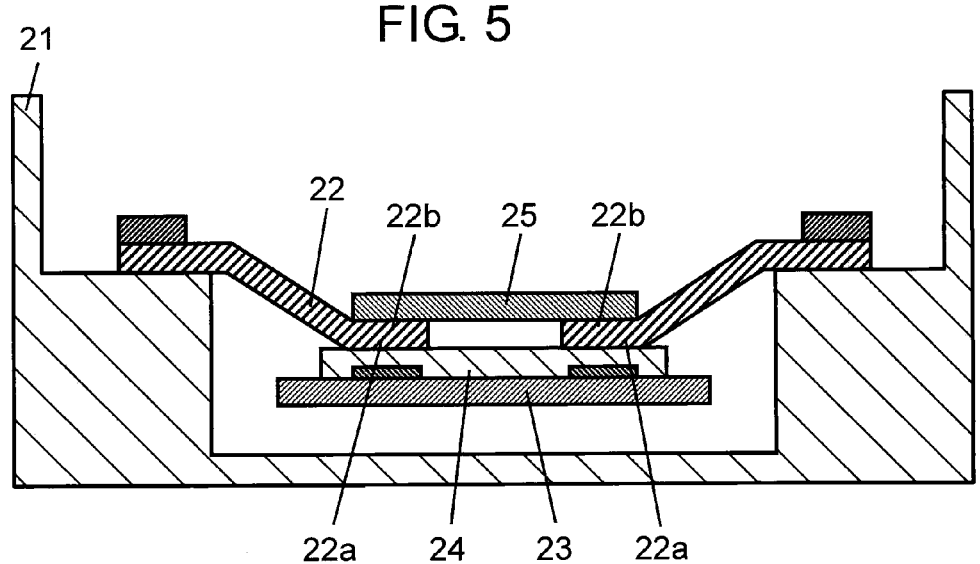
FIG. 5 is a sectional view showing another example of the piezoelectric device according to embodiment 2 of the present invention.

At the other ends of lead wires 22, it is desirable to provide support member 25 on surfaces 22b opposite to retaining surfaces 22a for connecting lead wires 22 to piezoelectric oscillator 23 as shown in FIG. 5. When support member 25 is thus provided on surfaces 22b opposite to retaining surfaces 22a for connecting lead wires 22 to piezoelectric oscillator 23 at the other ends of lead wires 22, a stress applied to between lead wires 22 and insulation layer 24 can be dispersed in support member 25. This avoids such an unfavorable event that the stress may be locally concentrated on where lead wires 22 and insulation layer 24 are connected. As a result, the device can improve its reliability in, for example, mechanical and electric characteristics.

Materials of support member 25 are, for example, heat resistant resins such as polyimide and epoxy. More specifically, any of these resins is solidified in a plate shape and bonded to the opposite surfaces by, for example, an adhesive.

Support member 25 is provided from surfaces 22b opposite to retaining surfaces 22a for connecting lead wires 22 to piezoelectric oscillator 23 at the other ends of lead wires 22 to such a position that enables a surface contact with insulation layer 24. Accordingly, an area where support member 25 contacts lead wires 22 and insulation layer 24 can be increased, and lead wires 22 and insulation layer 24 can be more inseparably bonded to each other by support member 25. As a result, these members can improve their reliability in view of electrical connection. Support member 25 thus useful can be formed by applying heat resistant liquid resin such as polyimide or epoxy to lead wires 22 and insulation layer 24 and then curing the applied resin.

In a manner similar to piezoelectric oscillator 13 of the piezoelectric device shown in FIG. 3 according to embodiment 1, piezoelectric oscillator 23 shown in FIG. 5 may have a structure where a base portion and a leg portion are provided, and the other ends of lead wires 22 are electrically connected to the base portion. Support member 25 is desirably formed so that an area thereof is equal to or larger than a surface area of the base portion to which lead wires 22 are connected because a stress generated by piezoelectric oscillator 23 can be thereby dispersed to a larger extent.

FIGS. 6 and 7 are upper views showing other examples of the piezoelectric devices according to embodiments 1 and 2.

It can be known from shapes of piezoelectric oscillator 13 shown in FIGS. 6 and 7 that piezoelectric oscillator 23 does not necessarily have the shape of a tuning fork as shown in piezoelectric oscillator 13 of FIG. 3, and can have other shapes as far as it has base and leg portions.

As a possible example of the shape, leg portion 13b diverges from base portion 13c into four branches in four directions, and two of the branches further diverge in two directions as shown in piezoelectric oscillator 13 used in the piezoelectric device of FIG. 6. Another possible example is a shape where leg portion 13b diverges from base portion 13c into two branches in two directions, and the two branches further diverge in two directions as shown in piezoelectric oscillator 13 used in the piezoelectric device of FIG. 7.

The IC and the circuit pattern may be formed outside of outer housing 21 to be electrically connected to one ends of lead wires 22 through via holes. However, the circuit pattern is desirably formed inside outer housing 21 because the elements and the circuit pattern can be integrally combined by outer housing 21.

The piezoelectric devices reduced in their vertical heights according to embodiments 1 and 2 can be loaded in, for example, an electronic device such as a digital camera and an automobile.

Figure 8:
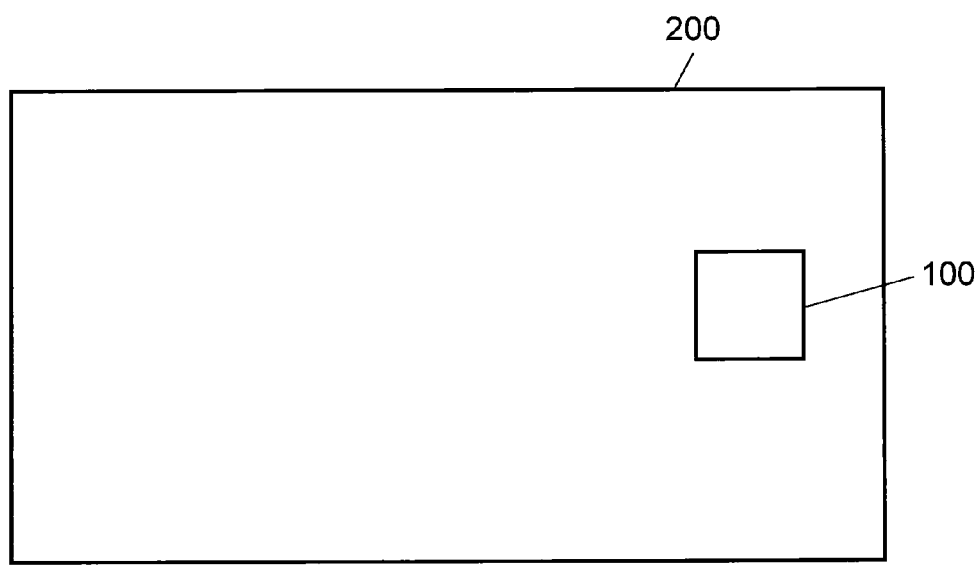
FIG. 8 is a plan view of an electronic device equipped with the piezoelectric devices according to embodiments 1 and 2 of the present invention.
Figure 9:
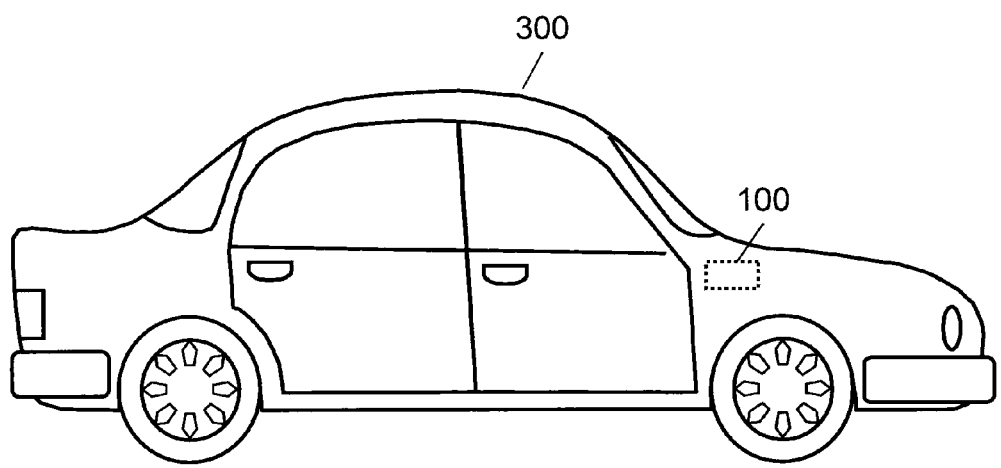
FIG. 9 is a side view of an automobile equipped with the piezoelectric devices according to embodiments 1 and 2 of the present invention.
Figure 10:
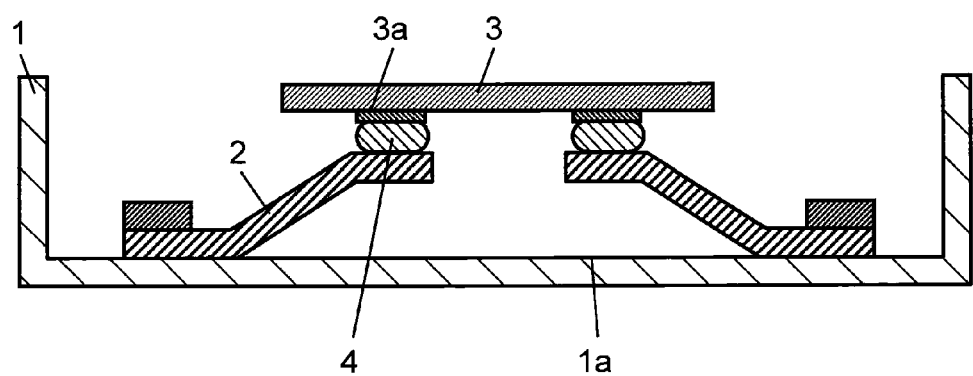
FIG. 10 is a sectional view of a conventional piezoelectric device.

FIG. 8 is a plan view of an electronic device loaded with either of the piezoelectric devices according to embodiments 1 and 2. FIG. 9 is a side view of an automobile loaded with either of the piezoelectric devices reduced in their vertical heights according to embodiments 1 and 2.

Electronic device 200 shown in FIG. 8 is equipped with, for example, piezoelectric device 100 shown in FIG. 1. Piezoelectric device 100 includes lead wires 12 each having one end electrically connected to a circuit pattern (not shown) and piezoelectric oscillator 13 made of quartz and having terminals 13a electrically connected to the other ends of lead wires 12 as shown in FIG. 1. In piezoelectric device 100, terminals 13a of piezoelectric oscillator 13 and lead wires 12 are respectively capacitively coupled with each other with insulation layer 14 interposed therebetween. In piezoelectric device 100, piezoelectric oscillator 13 is retained by the other ends of lead wires 12 in suspension as shown in FIG. 2. Support member 15 is provided on surfaces 12b opposite to retaining surfaces 12a for retaining piezoelectric oscillator 13 at the other ends of lead wires 12.

Electronic device 200 loaded with piezoelectric device 10 having such a structure that is reduced in its vertical height can be formed in a smaller thickness, and electronic device 200 thus thinner can further equip other electronic devices, thereby accomplishing a variety of functions.

Automobile 300 shown in FIG. 9 is loaded with piezoelectric device 100 reduced in its vertical height shown in FIGS. 1 and 2. Automobile 300 having thinner piezoelectric device 100 can further equip other electronic devices by reducing thicknesses of its components or creating a mounting space, thereby accomplishing a variety of functions.

More specifically, the piezoelectric devices according to embodiments 1 and 2 are mounted as, for example, a mobile telephone navigation sensor, an in-vehicle navigation sensor, a sensor used in a vehicle control system, or a blurred image correction sensor for an imaging element. Accordingly, other electronic components can be further mounted in a space created by the height reduction of the piezoelectric device. As a result, these sensors can achieve an increased number of functions enabled by the additional electronic components.

INDUSTRIAL APPLICABILITY

The piezoelectric device according to the present invention can achieve further reduction in its vertical height, and is advantageously used in an automobile and various electronic devices.

The invention claimed is:

1. A piezoelectric device comprising:
    a lead wire having one end electrically connected to a circuit pattern; and
    a piezoelectric oscillator made of quartz and having a terminal electrically connected to another end of the lead wire, wherein
    the terminal of the piezoelectric oscillator and the lead wire are capacitively coupled with each other via an insulation layer.

2. The piezoelectric device as claimed in claim 1, wherein
    the piezoelectric oscillator is retained in suspension by the another end of the lead wire, and
    a support member is provided on a surface opposite to a retaining surface for retaining the piezoelectric oscillator at the another end of the lead wire.

3. The piezoelectric device as claimed in claim 1, further comprising:
    an outer housing having a recessed portion in a bottom surface thereof, wherein
    the end of the lead wire is disposed on the bottom surface of the outer housing, and
    the piezoelectric oscillator is provided inside of the recessed portion.

4. The piezoelectric device as claimed in claim 3, wherein
    the piezoelectric oscillator is retained in suspension in the recessed portion by the another end of the lead wire, and a support member is provided on a surface opposite to a retaining surface for retaining the piezoelectric oscillator at the another end of the lead wire.

5. An electronic device equipped with a piezoelectric device comprising:
    a lead wire having one end electrically connected to a circuit pattern; and
    a piezoelectric oscillator made of quartz and having a terminal electrically connected to another end of the lead wire, wherein
    the terminal of the piezoelectric oscillator and the lead wire are capacitively coupled with each other via an insulation layer.

6. The electronic device as claimed in claim 5, wherein
    in the piezoelectric device,
    the piezoelectric oscillator is retained in suspension by the another end of the lead wire, and
    a support member is provided on a surface opposite to a retaining surface for retaining the piezoelectric oscillator at the another end of the lead wire.

7. An automobile equipped with a piezoelectric device comprising:
    a lead wire having one end electrically connected to a circuit pattern; and
    a piezoelectric oscillator made of quartz and having a terminal electrically connected to another end of the lead wire, wherein
    the terminal of the piezoelectric oscillator and the lead wire are capacitively coupled with each other via an insulation layer.

8. The automobile as claimed in claim 7, wherein
    in the piezoelectric device,
    the piezoelectric oscillator is retained in suspension by the another end of the lead wire, and
    a support member is provided on a surface opposite to a retaining surface for retaining the piezoelectric oscillator at the another end of the lead wire.

* * * * *